(12) United States Patent
Haase et al.

(10) Patent No.: US 7,902,542 B2
(45) Date of Patent: Mar. 8, 2011

(54) ADAPTED LED DEVICE WITH RE-EMITTING SEMICONDUCTOR CONSTRUCTION

(75) Inventors: Michael A. Haase, St. Paul, MN (US); Catherine A. Leatherdale, Woodbury, MN (US); Thomas J. Miller, Woodbury, MN (US); Andrew J. Ouderkirk, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 244 days.

(21) Appl. No.: 11/755,010

(22) Filed: May 30, 2007

(65) Prior Publication Data

US 2007/0290190 A1    Dec. 20, 2007

Related U.S. Application Data

(60) Provisional application No. 60/804,800, filed on Jun. 14, 2006.

(51) Int. Cl.
  *H01L 29/06* (2006.01)
(52) U.S. Cl. .......................................................... 257/13
(58) Field of Classification Search ............... 257/13, 257/79–103, 918, E51.018–E51.022, E33.001–E33.077, 257/E33.054, E25.028, E25.032, E29.069–E29.071, 257/E29.245, E21.371, E21.387, E21.403–E21.407, 257/E21.441, E21.445, E21.448–E21.452, 257/9, E21.086, E21.097–E21.1, E21.108–E21.113, 257/E21.117–E21.118, E21.542, E21.543, 257/E21.697–E21.699; 438/22–47, 69, 493, 438/503, 507, 956, 77, 84, 93–95, 102, 104, 438/188, 189, 285, 603–604, 606, 930–933
See application file for complete search history.

(56) References Cited

U.S. PATENT DOCUMENTS

| | | | |
|---|---|---|---|
| 5,087,949 A | 2/1992 | Haitz | |
| 5,252,839 A | 10/1993 | Fouquet | |
| 5,625,636 A | 4/1997 | Bryan et al. | |
| 5,814,839 A | 9/1998 | Hosoba | |
| 5,851,905 A | 12/1998 | McIntosh et al. | |
| 5,915,193 A | 6/1999 | Tong et al. | |
| 5,955,749 A | 9/1999 | Joannopoulos et al. | |
| 5,998,925 A | 12/1999 | Shimizu et al. | |
| 6,054,719 A | 4/2000 | Fusser et al. | |
| 6,091,083 A | 7/2000 | Hata et al. | |
| 6,292,576 B1 | 9/2001 | Brownlee | |
| 6,303,404 B1 | 10/2001 | Moon et al. | |

(Continued)

FOREIGN PATENT DOCUMENTS

CN            1445869         10/2003

(Continued)

OTHER PUBLICATIONS

U.S. Appl. No. 11/761,078, filed Jun. 11, 2007, Titled "LED Device with Re-emitting Semiconductor Construction and Optical Element."

(Continued)

*Primary Examiner* — Dao H Nguyen
*Assistant Examiner* — Tram H Nguyen
(74) *Attorney, Agent, or Firm* — Robert S. Moshrefzadeh

(57) ABSTRACT

An article includes an LED that has an emitting surface. A reemitting semiconductor structure has an emitting surface and converts light emitted by the LED to light of a different wavelength. At least one of the emitting surfaces frustrates total internal reflection.

10 Claims, 4 Drawing Sheets

U.S. PATENT DOCUMENTS

| | | | |
|---|---|---|---|
| 6,328,456 B1 | 12/2001 | Mize | |
| 6,337,536 B1 | 1/2002 | Matsubara et al. | |
| 6,429,462 B1 | 8/2002 | Shveykin | |
| 6,473,554 B1 | 10/2002 | Pelka et al. | |
| 6,476,412 B1 | 11/2002 | Kano | |
| 6,504,171 B1 | 1/2003 | Grillot et al. | |
| 6,555,958 B1 | 4/2003 | Srivastava et al. | |
| 6,563,133 B1 | 5/2003 | Tong | |
| 6,566,688 B1 | 5/2003 | Zhang et al. | |
| 6,610,598 B2 | 8/2003 | Chen | |
| 6,618,420 B1 | 9/2003 | Gen-Ei et al. | |
| 6,649,939 B1 | 11/2003 | Wirth | |
| 6,717,362 B1 | 4/2004 | Lee et al. | |
| 6,720,730 B2 | 4/2004 | Salam | |
| 6,734,467 B2 | 5/2004 | Schlereth et al. | |
| 6,824,660 B2 | 11/2004 | Tomita | |
| 6,849,881 B1 | 2/2005 | Harle et al. | |
| 6,924,512 B2 | 8/2005 | Tsuda et al. | |
| 7,009,210 B2 | 3/2006 | Sarathy et al. | |
| 7,038,245 B2 | 5/2006 | Nitta et al. | |
| 7,045,375 B1 | 5/2006 | Wu et al. | |
| 7,135,073 B2 | 11/2006 | Heuken et al. | |
| 7,266,279 B1 | 9/2007 | Yap et al. | |
| 7,304,425 B2 | 12/2007 | Ouderkirk et al. | |
| 7,700,939 B2 | 4/2010 | Miller et al. | |
| 7,763,903 B2 * | 7/2010 | Orita | 257/98 |
| 2002/0030194 A1 | 3/2002 | Camras et al. | |
| 2002/0041148 A1 | 4/2002 | Cho et al. | |
| 2002/0134989 A1 | 9/2002 | Yao et al. | |
| 2002/0139984 A1 * | 10/2002 | Sugawara et al. | 257/79 |
| 2003/0006430 A1 * | 1/2003 | Shibata et al. | 257/200 |
| 2003/0111667 A1 | 6/2003 | Schubert | |
| 2003/0178626 A1 | 9/2003 | Sugiyama et al. | |
| 2004/0072047 A1 | 4/2004 | Markoski et al. | |
| 2004/0075102 A1 | 4/2004 | Chen et al. | |
| 2005/0007793 A1 | 1/2005 | Yoshida et al. | |
| 2005/0023545 A1 | 2/2005 | Camras et al. | |
| 2005/0039788 A1 | 2/2005 | Blieske et al. | |
| 2005/0082562 A1 * | 4/2005 | Ou et al. | 257/103 |
| 2005/0110990 A1 | 5/2005 | Koo et al. | |
| 2006/0050081 A1 | 3/2006 | Kobayashi et al. | |
| 2006/0076883 A1 * | 4/2006 | Himaki et al. | 313/503 |
| 2006/0091411 A1 | 5/2006 | Ouderkirk et al. | |
| 2006/0091414 A1 * | 5/2006 | Ouderkirk et al. | 257/99 |
| 2006/0091784 A1 | 5/2006 | Conner et al. | |
| 2006/0092532 A1 | 5/2006 | Ouderkirk et al. | |
| 2006/0094322 A1 | 5/2006 | Ouderkirk et al. | |
| 2006/0094340 A1 | 5/2006 | Ouderkirk et al. | |
| 2006/0124917 A1 * | 6/2006 | Miller et al. | 257/13 |
| 2006/0124918 A1 | 6/2006 | Miller et al. | |
| 2006/0210726 A1 | 9/2006 | Jones et al. | |
| 2007/0008257 A1 | 1/2007 | Seo et al. | |
| 2007/0018183 A1 * | 1/2007 | Denbaars et al. | 257/98 |
| 2007/0108462 A1 * | 5/2007 | Park et al. | 257/98 |
| 2007/0116423 A1 | 5/2007 | Leatherdale et al. | |
| 2007/0221867 A1 | 9/2007 | Beeson et al. | |
| 2007/0256453 A1 | 11/2007 | Barnes et al. | |
| 2007/0257266 A1 | 11/2007 | Leatherdale et al. | |
| 2007/0257267 A1 | 11/2007 | Leatherdale et al. | |
| 2007/0257270 A1 | 11/2007 | Lu et al. | |
| 2007/0257271 A1 | 11/2007 | Ouderkirk et al. | |
| 2007/0258246 A1 | 11/2007 | Leatherdale et al. | |
| 2007/0284565 A1 | 12/2007 | Leatherdale et al. | |
| 2008/0006832 A1 | 1/2008 | Haase | |
| 2009/0128737 A1 | 5/2009 | Ouderkirk et al. | |
| 2009/0184624 A1 | 7/2009 | Schmidt et al. | |
| 2009/0207628 A1 | 8/2009 | Haase et al. | |

FOREIGN PATENT DOCUMENTS

| | | |
|---|---|---|
| CN | 1705732 | 12/2005 |
| EP | 1 345 276 | 9/2003 |
| JP | 2004-072047 | 3/2004 |
| JP | 17-055481 | 3/2005 |
| KR | 10-2004-0089084 | 10/2004 |
| WO | WO 2005/038937 | 4/2005 |

OTHER PUBLICATIONS

U.S. Appl. No. 11/761,144, filed Jun. 11, 2007, Titled "LED Device with Re-emitting Semiconductor Construction and Converging Optical Element."

U.S. Appl. No. 11/761,067, filed Jun. 11, 2007, Titled "LED Device with Re-emitting Semiconductor Construction and Converging Optical Element."

Dalmasso et al., Injection Dependence of the Electroluminescence Spectra of Re-emitting semiconductor construction Free GaN-Based White Light Emitting Diodes. *Phys. Stat. Sol.* (a), vol. 192, No. 1, pp. 139-143 (2003).

Damilano et al., Monolithic White Light Emitting Diodes Based on InGaN/GaN Multiple-Quantum Wells, *Japanese Journal of Applied Physics*, vol. 40, pp. L918-L920 (2001).

Kroemer, *Quantum Mechanics for Engineering, Materials Science and Applied Physics* Prentice Hall, Englewood Cliffs, NJ, pp. 54-63, (1994).

Luo et al., Patterned three-color ZnCdASe/ZnCdMgSe quantum-well structures for integrated full-color and white light emitters, *Applied Physics Letters*, vol. 77, No. 26, pp. 4259-4261 (2000).

Murai et al., Wafer Bonding of GaN and ZnSSe for Optoelectronic Applications, *Japanese Journal of Applied Physics*, vol. 43 No. 10A, p. L1275 (2004).

Tong et al., *Semiconductor Wafer Bonding*, John Wiley & Sons, NY, pp. 49-101 (1999).

Tong et al., *Semiconductor Wafer Bonding*, John Wiley & Sons, NY, pp. 223-232 (1999).

Yamada et al., Phosphor Free High-Luminous-Efficiency White Light-Emitting Diodes Composed of InGaN Multi-Quantum Well, *Japanese Journal of Applied Physics*. vol. 41 pp. L246-248 (2002).

Zory, *Quantum Well Lasers*, Academic Press, San Diego, CA, pp. 72-79 (1993).

International Search Report for PCT Application No. PCT/US2007/070533, 3 pages.

International Written Opinion for PCT Application No. PCT/US2007/070533, 4 pages.

U.S. Appl. No. 60/804,824, entitled "LED Device with Re-Emitting Semiconductor Construction and Optical Element", filed on Jun. 14, 2006.

U.S. Appl. No. 60/804,824, entitled "LED Device with Re-Emitting Semiconductor Construction and Extractor", filed on Jun. 12, 2006.

U.S. Appl. No. 60/804,800, entitled "Adapted LED Device with Re-Emitting Semiconductor Construction", filed on Jun. 14, 2006.

U.S. Appl. No. 60/804,544, entitled "LED Device with Re-Emitting Semiconductor Construction and Converging Optical Element", filed on Jun. 12, 2006.

* cited by examiner

ADAPTED LED DEVICE WITH RE-EMITTING SEMICONDUCTOR CONSTRUCTION

CROSS REFERENCE TO RELATED APPLICATIONS

This application claims the benefit of U.S. Provisional Patent Application No. 60/804,800, filed Jun. 14, 2006, the disclosure of which is incorporated by reference herein in its entirety.

The following co-owned and currently pending U.S. patent applications are incorporated herein by reference: U.S. Ser. No. 11/009,217 and U.S. Ser. No. 11/009,241.

FIELD OF THE DISCLOSURE

The present invention relates to light sources. More particularly, the present invention relates to light sources including a light emitting diode (LED) and a re-emitting semiconductor construction adapted for increased light extraction.

BACKGROUND OF THE DISCLOSURE

Light emitting diodes (LED's) are solid-state semiconductor devices which emit light when an electrical current is passed between anode and cathode. Conventional LED's contain a single pn junction. The pn junction may include an intermediate undoped region; this type of pn junction may also be called a pin junction. Like non-light emitting semiconductor diodes, conventional LED's pass an electrical current much more readily in one direction, i.e., in the direction where electrons are moving from the n-region to the p-region. When a current passes in the "forward" direction through the LED, electrons from the n-region recombine with holes from the p-region, generating photons of light. The light emitted by a conventional LED is monochromatic in appearance; that is, it is generated in a single narrow band of wavelengths. The wavelength of the emitted light corresponds to the energy associated with electron-hole pair recombination. In the simplest case, that energy is approximately the band gap energy of the semiconductor in which the recombination occurs.

Conventional LED's may additionally contain one or more quantum wells at the pn junction which capture high concentrations of both electrons and holes, thereby enhancing light-producing recombination. Several investigators have attempted to produce an LED device which emits white light, or light which appears white to the 3-color perception of the human eye.

Some investigators report the purported design or manufacture of LED's having multiple quantum wells within the pn junction, where the multiple quantum wells are intended to emit light at different wavelengths. The following references may be relevant to such a technology: U.S. Pat. No. 5,851,905; U.S. Pat. No. 6,303,404; U.S. Pat. No. 6,504,171; U.S. Pat. No. 6,734,467; Damilano et al., *Monolithic White Light Emitting Diodes Based on InGaN/GaN Multiple-Quantum Wells*, Jpn. J. Appl. Phys. Vol. 40 (2001) pp. L918-L920; Yamada et al., *Re-emitting semiconductor construction Free High-Luminous-Efficiency White Light-Emitting Diodes Composed of InGaN Multi-Quantum Well*, Jpn. J. Appl. Phys. Vol. 41 (2002) pp. L246-L248; Dalmasso et al., *Injection Dependence of the Electroluminescence Spectra of Re-emitting semiconductor construction Free GaN-Based White Light Emitting Diodes*, phys. stat. sol. (a) 192, No. 1, 139-143 (2003).

Some investigators report the purported design or manufacture of LED devices which combine two conventional LED's, intended to independently emit light at different wavelengths, in a single device. The following references may be relevant to such a technology: U.S. Pat. No. 5,851,905; U.S. Pat. No. 6,734,467; U.S. Pat. Pub. No. 2002/0041148 A1; U.S. Pat. Pub. No. 2002/0134989 A1; and Luo et al., *Patterned three-color ZnCdSe/ZnCdMgSe quantum-well structures for integrated full-color and white light emitters*, App. Phys. Letters, vol. 77, no. 26, pp. 4259-4261 (2000).

Some investigators report the purported design or manufacture of LED devices which combine a conventional LED element with a chemical re-emitting semiconductor construction, such as yttrium aluminum garnet (YAG), which is intended to absorb a portion of the light emitted by the LED element and re-emit light of a longer wavelength. U.S. Pat. No. 5,998,925 and U.S. Pat. No. 6,734,467 may be relevant to such a technology.

Some investigators report the purported design or manufacture of LED's grown on a ZnSe substrate n-doped with I, Al, Cl, Br, Ga or In so as to create fluorescing centers in the substrate, which are intended to absorb a portion of the light emitted by the LED element and re-emit light of a longer wavelength. U.S. Pat. No. 6,337,536 and Japanese Pat. App. Pub. No. 2004-072047 may be relevant to such a technology.

US Pat. Pub. No. 2005/0023545 is incorporated herein by reference.

SUMMARY OF THE DISCLOSURE

Briefly, the present invention relates to light sources including a light emitting diode (LED) and a re-emitting semiconductor construction adapted for increased light extraction.

In this application:

with regard to a stack of layers in a semiconductor device, "immediately adjacent" means next in sequence without intervening layers, "closely adjacent" means next in sequence with one or a few intervening layers, and "surrounding" means both before and after in sequence;

"potential well" means a layer of semiconductor in a semiconductor device which has a lower conduction band energy than surrounding layers or a higher valence band energy than surrounding layers, or both;

"quantum well" means a potential well which is sufficiently thin that quantization effects raise the electron-hole pair transition energy in the well, typically having a thickness of 100 nm or less;

"transition energy" means electron-hole recombination energy;

"lattice-matched" means, with reference to two crystalline materials, such as an epitaxial film on a substrate, that each material taken in isolation has a lattice constant, and that these lattice constants are substantially equal, typically not more than 0.2% different from each other, more typically not more than 0.1% different from each other, and most typically not more than 0.01% different from each other; and "pseudomorphic" means, with reference to a first crystalline layer of given thickness and a second crystalline layer, such as an epitaxial film and a substrate, that each layer taken in isolation has a lattice constant, and that these lattice constants are sufficiently similar so that the first layer, in the given thickness, can adopt the lattice spacing of the second layer in the plane of the layer substantially without misfit defects.

It should be understood that, for any embodiment of the present invention described herein comprising n-doped and p-doped semiconductor regions, a further embodiment should be considered as disclosed herein wherein n doping is exchanged with p doping and vice-versa.

It should be understood that, where each of "potential well," "first potential well," "second potential well" and "third potential well" are recited herein, a single potential well may be provided or multiple potential wells, which typically share similar properties, may be provided. Likewise, it should be understood that, where each of "quantum well," "first quantum well," "second quantum well" and "third quantum well" are recited herein, a single quantum well may be provided or multiple quantum wells, which typically share similar properties, may be provided.

DETAILED DESCRIPTION

Figure 1:
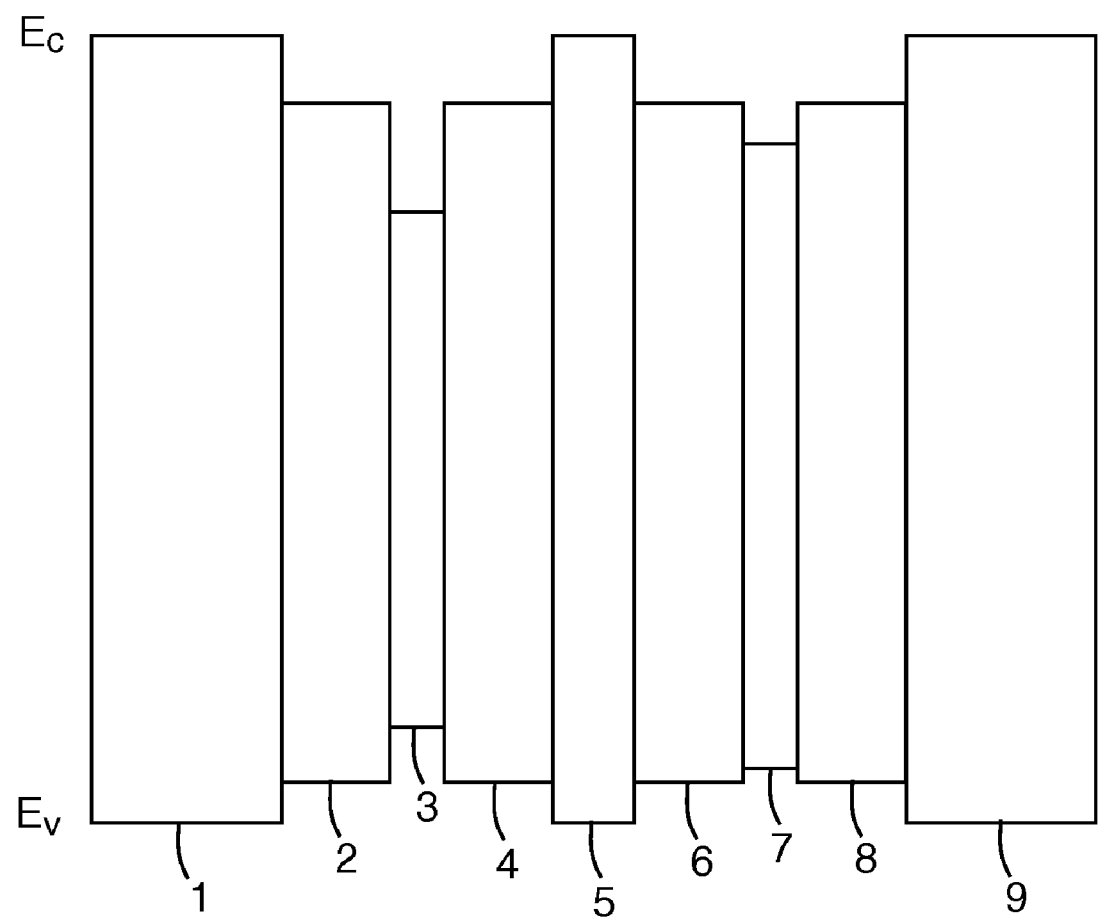
FIG. 1 is a flat-band diagram of conduction and valence bands of semiconductors in a construction according to one embodiment of the present invention. Layer thickness is not represented to scale.

The present invention provides a device comprising an LED and a re-emitting semiconductor construction which are adapted for increased extraction of light. Typically the LED is capable of emitting light at a first wavelength and the a re-emitting semiconductor construction is capable of absorbing light at that first wavelength and re-emitting light at a second wavelength. The a re-emitting semiconductor construction comprises a potential well not located within a pn junction. The potential wells of the re-emitting semiconductor construction are typically but not necessarily quantum wells.

In typical operation, the LED emits photons in response to an electric current and the re-emitting semiconductor construction emits photons in response to the absorption of a portion of the photons emitted from the LED. In one embodiment, the re-emitting semiconductor construction additionally comprises an absorbing layer closely or immediately adjacent to the potential well. Absorbing layers typically have a band gap energy which is less than or equal to the energy of photons emitted by the LED and greater than the transition energy of the potential wells of the re-emitting semiconductor construction. In typical operation the absorbing layers assist absorption of photons emitted from the LED. In one embodiment, the re-emitting semiconductor construction additionally comprises at least one second potential well not located within a pn junction having a second transition energy not equal to the transition energy of the first potential well. In one embodiment, the LED is a UV LED. In one such embodiment, the re-emitting semiconductor construction comprises at least one first potential well not located within a pn junction having a first transition energy corresponding to blue-wavelength light, at least one second potential well not located within a pn junction having a second transition energy corresponding to green-wavelength light, and at least one third potential well not located within a pn junction having a third transition energy corresponding to red-wavelength light. In one embodiment, the LED is a visible light LED, typically a green, blue or violet LED, more typically a green or blue LED, and most typically a blue LED. In one such embodiment, the re-emitting semiconductor construction comprises at least one first potential well not located within a pn junction having a first transition energy corresponding to yellow- or green-wavelength light, more typically green-wavelength light, and at least one second potential well not located within a pn junction having a second transition energy corresponding to orange- or red-wavelength light, more typically red-wavelength light. The re-emitting semiconductor construction may comprise additional potential wells and additional absorbing layers.

Any suitable LED may be used in the practice of the present invention. Elements of the device according to the present invention, including the LED and the re-emitting semiconductor construction, may be composed of any suitable semiconductors, including Group IV elements such as Si or Ge (other than in light-emitting layers), III-V compounds such as InAs, AlAs, GaAs, InP, AlP, GaP, InSb, AlSb, GaSb, and alloys thereof, II-VI compounds such as ZnSe, CdSe, BeSe, MgSe, ZnTe, CdTe, BeTe, MgTe, ZnS, CdS, BeS, MgS and alloys thereof, or alloys of any of the above. Where appropriate, the semiconductors may be n-doped or p-doped by any suitable method or by inclusion of any suitable dopant. In one typical embodiment, the LED is a III-V semiconductor device and the re-emitting semiconductor construction is a II-VI semiconductor device.

Figure 2:
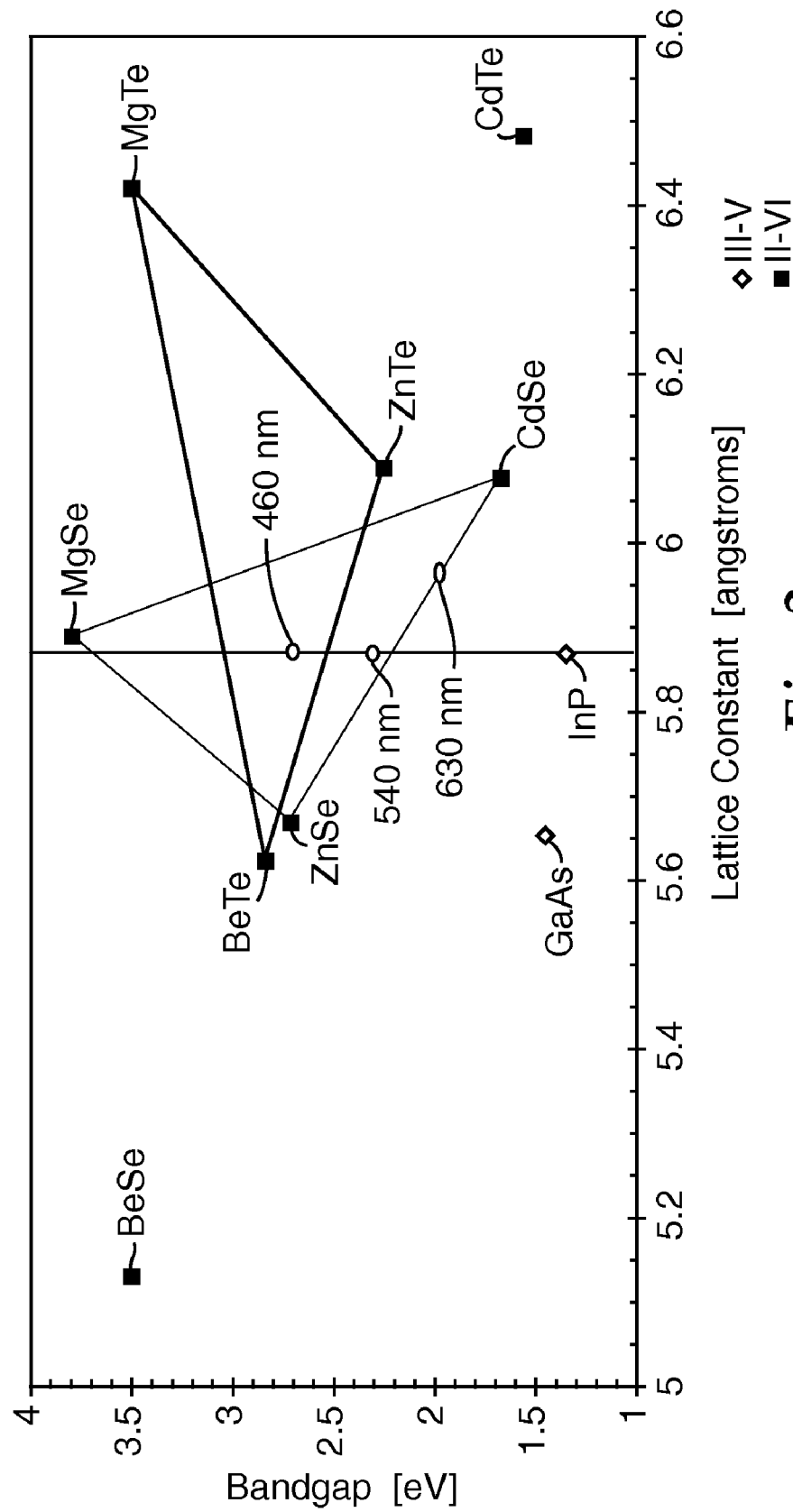
FIG. 2 is a graph indicating lattice constant and band gap energy for a variety of II-VI binary compounds and alloys thereof.

In one embodiment of the present invention, the compositions of the various layers of a component of the device, such the LED or the re-emitting semiconductor construction, are selected in light of the following considerations. Each layer typically will be pseudomorphic to the substrate at the thickness given for that layer or lattice matched to the substrate. Alternately, each layer may be pseudomorphic or lattice matched to immediately adjacent layers. Potential well layer materials and thicknesses are typically chosen so as to provide a desired transition energy, which will correspond to the wavelength of light to be emitted from the quantum well. For example, the points labeled 460 nm, 540 nm and 630 nm in FIG. 2 represent Cd(Mg)ZnSe alloys having lattice constants close to that for an InP substrate (5.8687 Angstroms or 0.58687 nm) and band gap energies corresponding to wavelengths of 460 nm (blue), 540 nm (green) and 630 nm (red). Where a potential well layer is sufficiently thin that quantization raises the transition energy above the bulk band gap energy in the well, the potential well may be regarded as a quantum well. The thickness of each quantum well layer will determine the amount of quantization energy in the quantum well, which is added to the bulk band gap energy to determine the transition energy in the quantum well. Thus, the wavelength associated with each quantum well can be tuned by adjustment of the quantum well layer thickness. Typically thicknesses for quantum well layers are between 1 nm and 100 nm, more typically between 2 nm and 35 nm. Typically the quantization energy translates into a reduction in wavelength of 20 to 50 nm relative to that expected on the basis of the band gap energy alone. Strain in the emitting layer may also change the transition energy for potential wells and quantum wells, including the strain resulting from the imperfect match of lattice constants between pseudomorphic layers.

Techniques for calculating the transition energy of a strained or unstrained potential well or quantum well are known in the art, e.g., in Herbert Kroemer, *Quantum Mechanics for Engineering, Materials Science and Applied Physics* (Prentice Hall, Englewood Cliffs, N.J., 1994) at pp. 54-63;

and Zory, ed., *Quantum Well Lasers* (Academic Press, San Diego, Calif., 1993) at pp. 72-79; both incorporated herein by reference.

Any suitable emission wavelengths may be chosen, including those in the infrared, visible, and ultraviolet bands. In one embodiment of the present invention, the emission wavelengths are chosen so that the combined output of light emitted by the device creates the appearance of any color that can be generated by the combination of two, three or more monochromatic light sources, including white or near-white colors, pastel colors, magenta, cyan, and the like. In another embodiment, the device according to the present invention emits light at an invisible infrared or ultraviolet wavelength and at a visible wavelength as an indication that the device is in operation. Typically the LED emits photons of the shortest wavelength, so that photons emitted from the LED have sufficient energy to drive the potential wells in the re-emitting semiconductor construction. In one typical embodiment, the LED is a III-V semiconductor device, such as a blue-emitting GaN-based LED, and re-emitting semiconductor construction is a II-VI semiconductor device.

FIG. 1 is a band diagram representing conduction and valence bands of semiconductors in a re-emitting semiconductor construction according to one embodiment of the present invention. Layer thickness is not represented to scale. Table I indicates the composition of layers 1-9 in this embodiment and the band gap energy ($E_g$) for that composition. This construction may be grown on an InP substrate.

TABLE I

| Layer | Composition | Band gap Energy ($E_g$) |
|---|---|---|
| 1 | $Cd_{0.24}Mg_{0.43}Zn_{0.33}Se$ | 2.9 eV |
| 2 | $Cd_{0.35}Mg_{0.27}Zn_{0.38}Se$ | 2.6 eV |
| 3 | $Cd_{0.70}Zn_{0.30}Se$ | 1.9 eV |
| 4 | $Cd_{0.35}Mg_{0.27}Zn_{0.38}Se$ | 2.6 eV |
| 5 | $Cd_{0.24}Mg_{0.43}Zn_{0.33}Se$ | 2.9 eV |
| 6 | $Cd_{0.35}Mg_{0.27}Zn_{0.38}Se$ | 2.6 eV |
| 7 | $Cd_{0.33}Zn_{0.67}Se$ | 2.3 eV |
| 8 | $Cd_{0.35}Mg_{0.27}Zn_{0.38}Se$ | 2.6 eV |
| 9 | $Cd_{0.24}Mg_{0.43}Zn_{0.33}Se$ | 2.9 eV |

Layer 3 represents a single potential well which is a red-emitting quantum well having a thickness of about 10 nm. Layer 7 represents a single potential well which is a green-emitting quantum well having a thickness of about 10 nm. Layers 2, 4, 6 and 8 represent absorbing layers, each having a thickness of about 1000 nm. Layers 1, 5 and 9 represent support layers. Support layers are typically chosen so as to be substantially transparent light emitted from quantum wells 3 and 7 and from short-wavelength LED 20. Alternately, the device may comprise multiple red- or green-emitting potential wells or quantum wells separated by absorbing layers and/or support layers.

Figure 3:
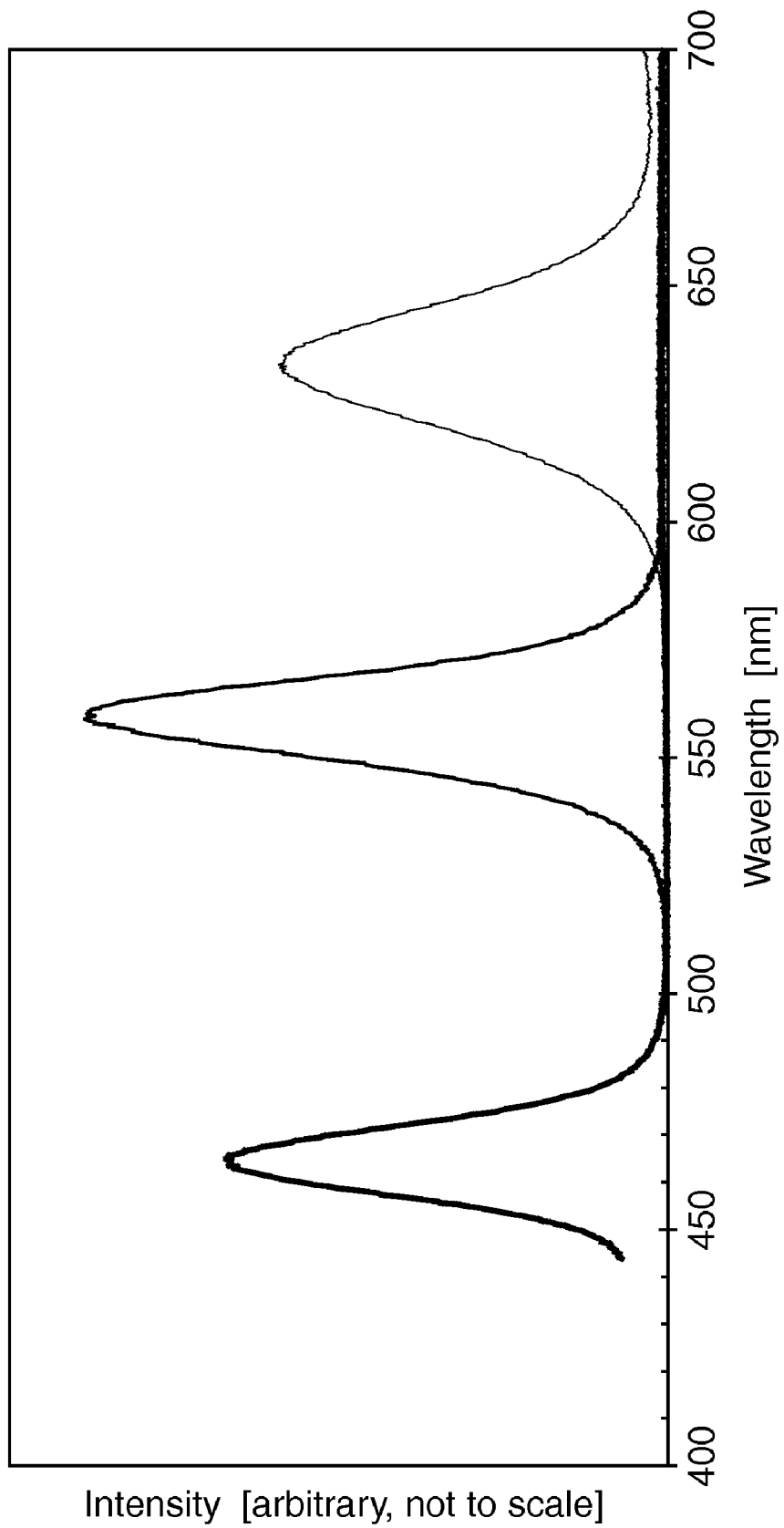
FIG. 3 is a graph representing the spectrum of light that emits from a device according to one embodiment of the present invention.

Without wishing to be bound by theory, it is believed that the embodiment of the present invention represented by FIG. 1 operates according to the following principles: Blue wavelength photons emitted by the LED and impinging upon the re-emitting semiconductor construction may be absorbed and re-emitted from the green-emitting quantum well 7 as green-wavelength photons or from the red-emitting quantum well 3 as red-wavelength photons. The absorption of a short-wavelength photon generates an electron-hole pair which may then recombine in the quantum wells, with the emission of a photon. The polychromatic combination of blue-, green- and red-wavelength light emitted from the device may appear white or near-white in color. The intensity of blue-, green- and red-wavelength light emitted from the device may be balanced in any suitable manner, including manipulation of the number of quantum wells of each type, the use of filters or reflective layers, and manipulation of the thickness and composition of absorbing layers. FIG. 3 represents a spectrum of light that emits from one embodiment of the device according to the present invention.

Again with reference to the embodiment represented by FIG. 1, absorbing layers 2, 4, 5 and 8 may be adapted to absorb photons emitted from the LED by selecting a band gap energy for the absorbing layers that is intermediate between the energy of photons emitted from the LED and the transition energies of quantum wells 3 and 7. Electron-hole pairs generated by absorption of photons in the absorbing layers 2, 4, 6 and 8 are typically captured by the quantum wells 3 and 7 before recombining with concomitant emission of a photon. Absorbing layers may optionally have a gradient in composition over all or a portion of their thickness, so as to funnel or direct electrons and/or holes toward potential wells. In some embodiments of the present invention, the LED and the re-emitting semiconductor construction are provided in a single semiconductor unit. This semiconductor unit typically contains a first potential well located within a pn junction and a second potential well not located within a pn junction. The potential wells are typically quantum wells. The unit is capable of emitting light at two wavelengths, one corresponding to the transition energy of the first potential well and a second corresponding to the transition energy of the second potential well. In typical operation, the first potential well emits photons in response to an electric current passing through the pn junction and the second potential well emits photons in response to the absorption of a portion of the photons emitted from the first potential well. The semiconductor unit may additionally comprise one or more absorbing layers surrounding or closely or immediately adjacent to the second potential well. Absorbing layers typically have a band gap energy which is less than or equal to the transition energy of the first potential well and greater than that of the second potential well. In typical operation the absorbing layers assist absorption of photons emitted from the first potential well. The semiconductor unit may comprise additional potential wells, located within the pn junction or located not within the pn junction, and additional absorbing layers.

Figure 4:
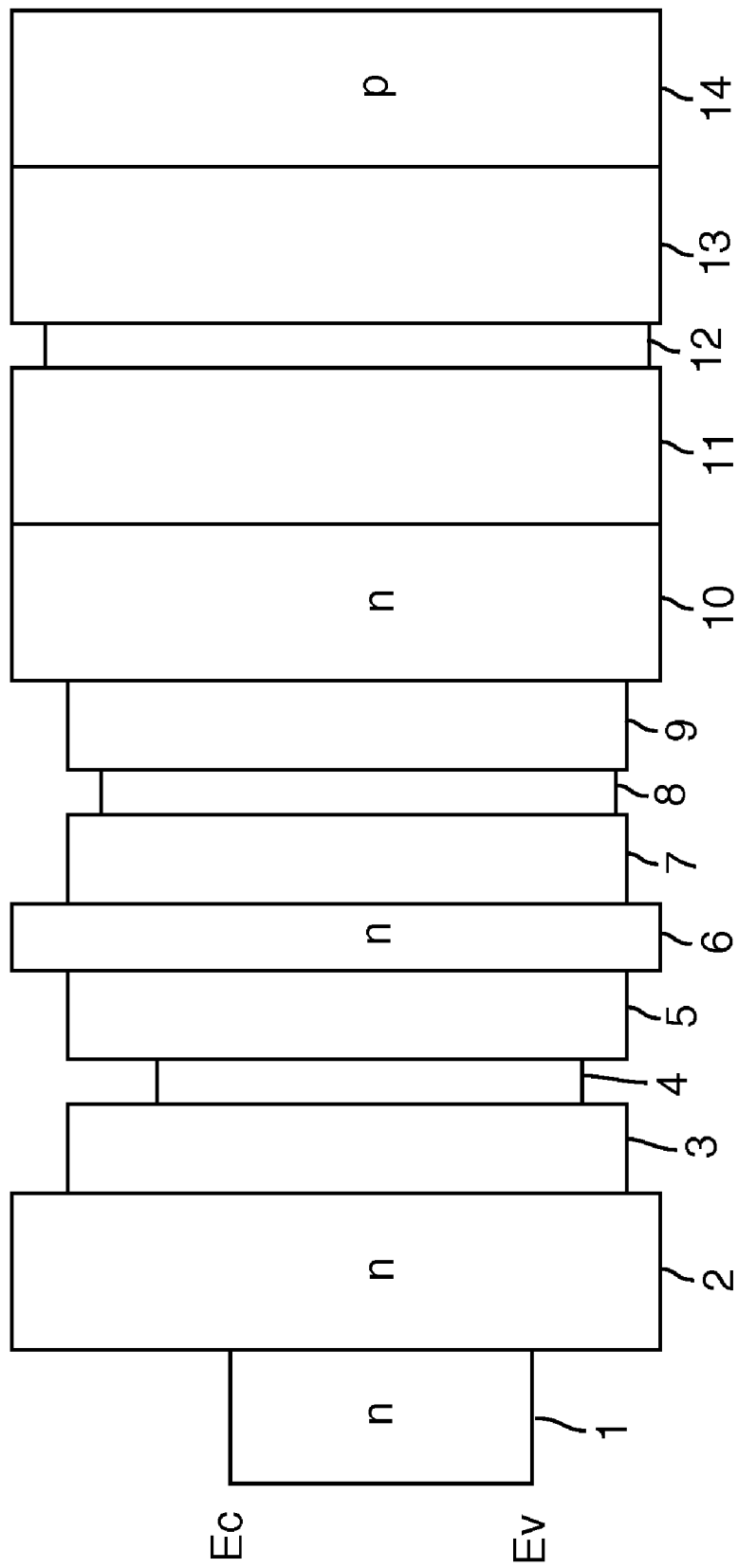
FIG. 4 is a flat-band diagram of conduction and valence bands of semiconductors in a construction according to one embodiment of the present invention. Layer thickness is not represented to scale.

FIG. 4 is a band diagram representing conduction and valence bands of semiconductors in such a semiconductor unit according to one embodiment of the present invention. Layer thickness is not represented to scale. Table II indicates the composition of layers 1-14 in this embodiment and the band gap energy ($E_g$) for that composition.

TABLE II

| Layer | Composition | Band gap Energy ($E_g$) |
|---|---|---|
| 1 | InP substrate | 1.35 eV |
| 2 | n-doped $Cd_{0.24}Mg_{0.43}Zn_{0.33}Se$ | 2.9 eV |
| 3 | $Cd_{0.35}Mg_{0.27}Zn_{0.38}Se$ | 2.6 eV |
| 4 | $Cd_{0.70}Zn_{0.30}Se$ | 1.9 eV |
| 5 | $Cd_{0.35}Mg_{0.27}Zn_{0.38}Se$ | 2.6 eV |
| 6 | n-doped $Cd_{0.24}Mg_{0.43}Zn_{0.33}Se$ | 2.9 eV |
| 7 | $Cd_{0.35}Mg_{0.27}Zn_{0.38}Se$ | 2.6 eV |
| 8 | $Cd_{0.33}Zn_{0.67}Se$ | 2.3 eV |
| 9 | $Cd_{0.35}Mg_{0.27}Zn_{0.38}Se$ | 2.6 eV |
| 10 | n-doped $Cd_{0.24}Mg_{0.43}Zn_{0.33}Se$ | 2.9 eV |
| 11 | undoped $Cd_{0.24}Mg_{0.43}Zn_{0.33}Se$ | 2.9 eV |
| 12 | $Cd_{0.31}Mg_{0.32}Zn_{0.37}Se$ | 2.7 eV |
| 13 | undoped $Cd_{0.24}Mg_{0.43}Zn_{0.33}Se$ | 2.9 eV |
| 14 | p-doped $Cd_{0.24}Mg_{0.43}Zn_{0.33}Se$ | 2.9 eV |

Layers 10, 11, 12, 13 and 14 represent a pn junction, or, more specifically, a pin junction, since intermediate undoped ("intrinsic" doping) layers 11, 12 and 13 are interposed between n-doped layer 10 and p-doped layer 14. Layer 12 represents a single potential well within the pn junction which is a quantum well having a thickness of about 10 nm. Alternately, the device may comprise multiple potential or quantum wells within the pn junction. Layers 4 and 8 represent second and third potential wells not within a pn junction, each being a quantum well having a thickness of about 10 nm. Alternately, the device may comprise additional potential or quantum wells not within the pn junction. In a further alternative, the device may comprise a single potential or quantum well not within the pn junction. Layers 3, 5, 7 and 9 represent absorbing layers, each having a thickness of about 1000 nm. Electrical contacts, not shown, provide a path for supply of electrical current to the pn junction. Electrical contacts conduct electricity and typically are composed of conductive metal. The positive electrical contact is electrically connected, either directly or indirectly through intermediate structures, to layer 14. The negative electrical contact is electrically connected, either directly or indirectly through intermediate structures, to one or more of layers 1, 2, 3, 4, 5, 6, 7, 8, 9 or 10.

Without wishing to be bound by theory, it is believed that this embodiment of the present invention operates according to the following principles: When an electrical current passes from layer 14 to layer 10, blue-wavelength photons are emitted from quantum well (12) in the pn junction. Photons traveling in the direction of layer 14 may leave the device. Photons traveling in the opposite direction may be absorbed and re-emitted from the second quantum well (8) as green-wavelength photons or from the third quantum well (4) as red-wavelength photons. The absorption of a blue-wavelength photon generates an electron-hole pair which may then recombine in the second or third quantum wells, with the emission of a photon. Green- or red-wavelength photons traveling in the direction of layer 14 may leave the device. The polychromatic combination of blue-, green- and red-wavelength light emitted from the device may appear white or near-white in color. The intensity of blue-, green- and red-wavelength light emitted from the device may be balanced in any suitable manner, including manipulation of the number of potential wells of each type and the use of filters or reflective layers. FIG. 3 represents a spectrum of light that emits from one embodiment of the device according to the present invention.

Again with reference to the embodiment represented by FIG. 4, absorbing layers 3, 5, 7 and 9 may be especially suitable to absorb photons emitted from the first quantum well (12), since they have a band gap energy that is intermediate between the transition energy of the first quantum well (12) and those of the second and third quantum wells (8 and 4). Electron-hole pairs generated by absorption of photons in the absorbing layers 3, 5, 7 and 9 are typically captured by the second or third quantum wells 8 and 4 before recombining with concomitant emission of a photon. Absorbing layers may optionally be doped, typically like to surrounding layers, which in this embodiment would be n-doping. Absorbing layers may optionally have a gradient in composition over all or a portion of their thickness, so as to funnel or direct electrons and/or holes toward potential wells.

Where the LED is a visible wavelength LED, the layers of the re-emitting semiconductor construction may be partially transparent to the light emitted from the LED. Alternately, such as where the LED is a UV wavelength LED, one or more of the layers of re-emitting semiconductor construction may block a greater portion or substantially or completely all of the light emitted from the LED, so that a greater portion or substantially or completely all of the light emitted from the device is light re-emitted from the re-emitting semiconductor construction. Where the LED is a UV wavelength LED, re-emitting semiconductor construction 10 may include red-, green- and blue-emitting quantum wells.

The device according to the present invention may comprise additional layers of conducting, semiconducting or non-conducting materials. Electrical contact layers may be added to provide a path for supply of electrical current to the LED. Light filtering layers may be added to alter or correct the balance of light wavelengths in the light emitted by the adapted LED.

In one embodiment, the device according to the present invention generates white or near-white light by emitting light at four principal wavelengths in the blue, green, yellow and red bands. In one embodiment, the device according to the present invention generates white or near-white light by emitting light at two principal wavelengths in the blue and yellow bands.

The device according to the present invention may comprise additional semiconductor elements comprising active or passive components such as resistors, diodes, zener diodes, capacitors, transistors, bipolar transistors, FET transistors, MOSFET transistors, insulated gate bipolar transistors, phototransistors, photodetectors, SCR's, thyristors, triacs, voltage regulators, and other circuit elements. The device according to the present invention may comprise an integrated circuit. The device according to the present invention may comprise a display panel or an illumination panel.

The LED and the re-emitting semiconductor construction which make up the device according to the present invention may be manufactured by any suitable method, which may include molecular beam epitaxy (MBE), chemical vapor deposition, liquid phase epitaxy and vapor phase epitaxy. The elements of the device according to the present invention may include a substrate. Any suitable substrate may be used in the practice of the present invention. Typical substrate materials include Si, Ge, GaAs, InP, sapphire, SiC and ZnSe. The substrate may be n-doped, p-doped, or semi-insulating, which may be achieved by any suitable method or by inclusion of any suitable dopant. Alternately, the elements of the device according to the present invention may be without a substrate. In one embodiment, elements of the device according to the present invention may be formed on a substrate and then separated from the substrate. The elements of the device according to the present invention may be joined together by any suitable method, including the use of adhesive or welding materials, pressure, heat or combinations thereof. Typically, the bond created is transparent. Bonding methods may include interfacial or edge bonding. Optionally, refractive index matching layers or interstitial spaces may be included.

LED's are typically sold in a packaged form that includes an LED die or chip mounted on a metal header. An LED die is an LED in its most basic form, i.e., in the form of an individual component or chip made by semiconductor wafer processing procedures. The component or chip can include electrical contacts suitable for application of power to energize the device. The individual layers and other functional elements of the component or chip are typically formed on the wafer scale, the finished wafer finally being diced into individual piece parts to yield a multiplicity of LED dies. The metal header has a reflective cup in which the LED die is mounted, and electrical leads connected to the LED die. The package further includes a molded transparent resin that encapsulates the LED die. The encapsulating resin typically has a nominally hemispherical front surface to partially collimate light emitted from the LED die. An LED component can be or comprise an LED die or an LED die in combination with a re-emitting semiconductor construction or other elements.

The light emitting diode (LED), the re-emitting semiconductor construction, or both may have an emitting surface. With reference to FIG. 1, the outer surface of layer 9 may represent an emitting surface. With reference to FIG. 4, the outer surface of layer 14 may represent an emitting surface. Either or both emitting surfaces may be adapted for increased light extraction. The adaptation typically serves to frustrate total internal reflection (TIR) and/or enhance light extraction efficiency.

In some embodiments, an emitting surface may be adapted by roughening the surface. Roughening may be by any suitable method, including abrasion, treatment with solvents, acids, bases or corrosive agents, reactive ion etching, plasma treatment, deposition or the like. Surface features may have typical dimensions of 0.1 microns to 10 microns. The features may be symmetrical or asymmetric. Roughening may be as described in U.S. Pat. App. Pub. No. 2005/0082562, incorporated herein by reference.

In some embodiments, an emitting surface may be adapted by microstructuring the surface. Microstructuring may be by any suitable method, including machining, molding, stamping, patterned chemical etching, photolithography, deposition or the like. Surface features may have typical dimensions of 0.1 microns to 100 microns. The features may be symmetrical or asymmetric. Microstructuring may be as described in U.S. Pat. No. 6,649,939, incorporated herein by reference.

In some embodiments, an emitting surface may be adapted by structuring the surface, such as by adding trenches, grooves, wells, ridges and the like. Structuring may be by any suitable method, including machining, molding, stamping, chemical etching, or the like. Surface features may have typical dimensions of 10 microns to 1000 microns. The features may be symmetrical or asymmetric. The structures may occur at the edges of the emitting surface, such as would occur with side beveling, or in the interior or the emitting surface. Structuring may be as described in U.S. Pat. No. 5,087,949, incorporated herein by reference.

In some embodiments, an emitting surface may be adapted by addition of a shaped encapsulant. The encapsulant may have any suitable shape, including lens shapes, cusp shapes, jelly bean shapes, and the like. The encapsulant may be any suitable organic or inorganic material, including glasses and polymers, such as epoxy, silicone, polycarbonate, and the like. The encapsulant may be added by any suitable method, including molding followed by curing, deposition followed by curing, or separate formation and subsequent attachment. The encapsulant may optionally include particulate matter, typically high index materials such as zirconia, titania, and the like, which are typically on the nanoparticle scale. The particles may be distributed evenly or in a gradient, which typically would provide a higher index in regions closer to the emitting surface. Encapsulants may be as described in U.S. Pat. No. 6,473,554, or U.S. Pat. No. 6,610,598, U.S. Pat. No. 6,717,362, incorporated herein by reference.

At least one emitting surface may be at least partially covered with a reflectivity enhancing layer, such as one selected from dielectric coatings, metal layers, interference reflectors, and the like. The reflectivity enhancing coating may additionally serve as an electrically conductive layer, either through direct conductivity or means discussed in U.S. Pat. 2003/0111667, incorporated herein by reference.

In some embodiments, an emitting surface may be adapted by addition of a photonic crystal, which may be as described in U.S. Pat. No. 5,955,749, incorporated herein by reference.

The light source according to the present invention may be a component or the critical component of a graphic display device such as a large- or small-screen video monitor, computer monitor or display, television, telephone device or telephone device display, personal digital assistant or personal digital assistant display, pager or pager display, calculator or calculator display, game or game display, toy or toy display, large or small appliance or large or small appliance display, automotive dashboard or automotive dashboard display, automotive interior or automotive interior display, marine dashboard or marine dashboard display, marine interior or marine interior display, aeronautic dashboard or aeronautic dashboard display, aeronautic interior or aeronautic interior display, traffic control device or traffic control device display, advertising display, advertising sign, or the like.

The light source according to the present invention may be a component or the critical component of a liquid crystal display (LCD), or like display, as a backlight to that display. In one embodiment, the semiconductor device according to the present invention is specially adapted for use a backlight for a liquid crystal display by matching the colors emitted by the semiconductor device according to the present invention to the color filters of the LCD display.

The light source according to the present invention may be a component or the critical component of an illumination device such as a free-standing or built-in lighting fixture or lamp, landscape or architectural illumination fixture, handheld or vehicle-mounted lamp, automotive headlight or taillight, automotive interior illumination fixture, automotive or non-automotive signaling device, road illumination device, traffic control signaling device, marine lamp or signaling device or interior illumination fixture, aeronautic lamp or signaling device or interior illumination fixture, large or small appliance or large or small appliance lamp, or the like; or any device or component used as a source of infrared, visible, or ultraviolet radiation.

Various modifications and alterations of this invention will become apparent to those skilled in the art without departing from the scope and principles of this invention, and it should be understood that this invention is not to be unduly limited to the illustrative embodiments set forth hereinabove.

We claim:

1. An article, comprising:
   an LED having a first emitting surface;
   a reemitting semiconductor structure converting light emitted by the LED to light of a different wavelength and having a second emitting surface, at least one of first and second emitting surfaces being adapted to frustrate total internal reflection;
   wherein the reemitting semiconductor structure comprises a potential well; and the LED comprises a III-V semiconductor and the reemitting semiconductor structure comprises a II-VI semiconductor.

2. The article of claim 1, wherein the at least one of first and second emitting surfaces is adapted by roughening the surface.

3. The article of claim 1, wherein the at least one of first and second emitting surfaces is adapted by being structured.

4. The article of claim 1, wherein the at least one of first and second emitting surfaces is adapted by being encapsulated with a shaped encapsulant.

5. The article of claim 1, wherein the LED is a UV or blue LED.

6. The article of claim 1, wherein the reemitting semiconductor structure converts light emitted by the LED to blue light.

7. The article of claim 1, wherein the reemitting semiconductor structure converts light emitted by the LED to yellow light.

8. The article of claim 1, wherein the reemitting semiconductor structure converts light emitted by the LED to green light.

9. The article of claim 1, wherein the reemitting semiconductor structure converts light emitted by the LED to orange light.

10. The article of claim 1, wherein the reemitting semiconductor structure converts light emitted by the LED to red light.

* * * * *

UNITED STATES PATENT AND TRADEMARK OFFICE
CERTIFICATE OF CORRECTION

| | | |
|---|---|---|
| PATENT NO. | : 7,902,542 B2 | Page 1 of 1 |
| APPLICATION NO. | : 11/755010 | |
| DATED | : March 8, 2011 | |
| INVENTOR(S) | : Michael A Haase et al. | |

It is certified that error appears in the above-identified patent and that said Letters Patent is hereby corrected as shown below:

Column 5,

Line 49, Before "light" insert -- to --.

Signed and Sealed this
Tenth Day of May, 2011

David J. Kappos
*Director of the United States Patent and Trademark Office*